(12) United States Patent
Shen et al.

(10) Patent No.: US 11,722,085 B2
(45) Date of Patent: Aug. 8, 2023

(54) IMPEDANCE MEASUREMENT FOR A HAPTIC LOAD

(71) Applicant: QUALCOMM Incorporated, San Diego, CA (US)

(72) Inventors: Liangguo Shen, San Diego, CA (US); Joseph Dale Rutkowski, Chandler, AZ (US); Joshua Zazzera, Chandler, AZ (US); Nathaniel Salazar, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 279 days.

(21) Appl. No.: 17/148,100

(22) Filed: Jan. 13, 2021

(65) Prior Publication Data
US 2022/0224269 A1    Jul. 14, 2022

(51) Int. Cl.
*H02P 25/034* (2016.01)
*G08B 6/00* (2006.01)

(52) U.S. Cl.
CPC ............. *H02P 25/034* (2016.02); *G08B 6/00* (2013.01)

(58) Field of Classification Search
CPC .................................. H02P 25/034; G08B 6/00
See application file for complete search history.

(56) References Cited

U.S. PATENT DOCUMENTS

| | | | |
|---|---|---|---|
| 10,871,818 B1 * | 12/2020 | De La Cropte De Chanterac | ...... G06F 1/325 |
| 2008/0231246 A1 | 9/2008 | Sugie et al. | |
| 2013/0082742 A1 | 4/2013 | Ren et al. | |
| 2013/0158921 A1 | 6/2013 | Shah et al. | |
| 2016/0285401 A1 * | 9/2016 | Murata | ................... H02P 6/182 |
| 2018/0158289 A1 | 6/2018 | Vasilev et al. | |
| 2023/0067179 A1 * | 3/2023 | Kim | ...................... G06F 1/1656 |

OTHER PUBLICATIONS

International Search Report and Written Opinion—PCT/US2021/072829—ISA/EPO—dated Mar. 25, 2022.

* cited by examiner

*Primary Examiner* — Zoheb S Imtiaz
(74) *Attorney, Agent, or Firm* — QUALCOMM Incorporated

(57) ABSTRACT

In some implementations, a measurement circuit may drive, using a first transistor, a first node of a haptic load. The measurement circuit may trigger a first comparator when a voltage driving the haptic load satisfies a first condition. The first comparator may have a first node connected, in parallel, to a drain of a second transistor and may have a second node connected to the first node of the haptic load. Additionally, the second transistor may have a gate connected to a gate of the first transistor and may have the drain connected to a first reference current.

26 Claims, 10 Drawing Sheets

IMPEDANCE MEASUREMENT FOR A HAPTIC LOAD

FIELD OF THE DISCLOSURE

Aspects of the present disclosure generally relate to haptic vibration and, for example, to impedance measurement for a haptic load.

BACKGROUND

User equipment (UE), such as smartphones, tablets, and other mobile computing devices, may use haptic vibration to communicate with a user. For example, the UE may use a haptic system to produce one or more vibrational patterns that provide tactile confirmations, alerts, or other messages to the user.

SUMMARY

In some implementations, a measurement circuit includes a first transistor configured to drive a first node of a haptic load; a second transistor having a gate connected to a gate of the first transistor and a drain connected to a first reference current; and a first comparator having a first node connected, in parallel, to the drain of the second transistor, and having a second node connected to the first node of the haptic load, wherein the first comparator triggers when a voltage driving the haptic load satisfies a first condition.

In some implementations, a measurement circuit includes a first transistor configured to drive a first node of a haptic load; a second transistor having a gate connected to a gate of the first transistor and a drain connected to a first reference current; and a first analog-to-digital converter having a first node connected, in parallel, to the drain of the second transistor, and having a second node connected to the first node of the haptic load, wherein the first analog-to-digital converter outputs a first ratio associated with an impedance of the haptic load.

In some implementations, a method performed by a measurement circuit includes driving, using a first transistor, a first node of a haptic load; and triggering a first comparator when a voltage driving the haptic load satisfies a first condition, wherein the first comparator has a first node connected, in parallel, to a drain of a second transistor and has a second node connected to the first node of the haptic load, and wherein the second transistor has a gate connected to a gate of the first transistor and has the drain connected to a first reference current.

In some implementations, a method performed by a measurement circuit includes driving, using a first transistor, a first node of a haptic load; and outputting, using a first analog-to-digital converter, a first ratio associated with an impedance of the haptic load, wherein the first analog-to-digital converter has a first node connected, in parallel, to a drain of a second transistor and has a second node connected to the first node of the haptic load, and wherein the second transistor has a gate connected to a gate of the first transistor and has the drain connected to a first reference current.

In some implementations, a non-transitory computer-readable medium storing a set of instructions includes one or more instructions that, when executed by one or more microprocessors, cause the one or more microprocessors to transmit an instruction to drive, using a first transistor, a first node of a haptic load; and receive output from a first comparator when a voltage driving the haptic load satisfies a first condition, wherein the first comparator has a first node connected, in parallel, to a drain of a second transistor and has a second node connected to the first node of the haptic load, and wherein the second transistor has a gate connected to a gate of the first transistor and has the drain connected to a first reference current.

In some implementations, a non-transitory computer-readable medium storing a set of instructions includes one or more instructions that, when executed by one or more microprocessors, cause the one or more microprocessors to transmit an instruction to drive, using a first transistor, a first node of a haptic load; and receive output, using a first analog-to-digital converter, a first ratio associated with an impedance of the haptic load, wherein the first analog-to-digital converter has a first node connected, in parallel, to a drain of a second transistor and has a second node connected to the first node of the haptic load, and wherein the second transistor has a gate connected to a gate of the first transistor and has the drain connected to a first reference current.

In some implementations, an apparatus includes means for driving, using a first transistor, a first node of a haptic load; and means for triggering a first comparator when a voltage driving the haptic load satisfies a first condition, wherein the first comparator has a first node connected, in parallel, to a drain of a second transistor and has a second node connected to the first node of the haptic load, and wherein the second transistor has a gate connected to a gate of the first transistor and has the drain connected to a first reference current.

In some implementations, an apparatus includes means for driving, using a first transistor, a first node of a haptic load; and means for outputting, using a first analog-to-digital converter, a first ratio associated with an impedance of the haptic load, wherein the first analog-to-digital converter has a first node connected, in parallel, to a drain of a second transistor and has a second node connected to the first node of the haptic load, and wherein the second transistor has a gate connected to a gate of the first transistor and has the drain connected to a first reference current.

Aspects generally include a method, apparatus, system, computer program product, non-transitory computer-readable medium, user device, user equipment, wireless communication device, and/or processing system as substantially described with reference to and as illustrated by the drawings and specification.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages will be better understood from the following description when considered in connection with the accompanying figures. Each of the figures is provided for the purposes of illustration and description, and not as a definition of the limits of the claims.

BRIEF DESCRIPTION OF THE DRAWINGS

So that the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects. The same reference numbers in different drawings may identify the same or similar elements.

DETAILED DESCRIPTION

Figure 1:
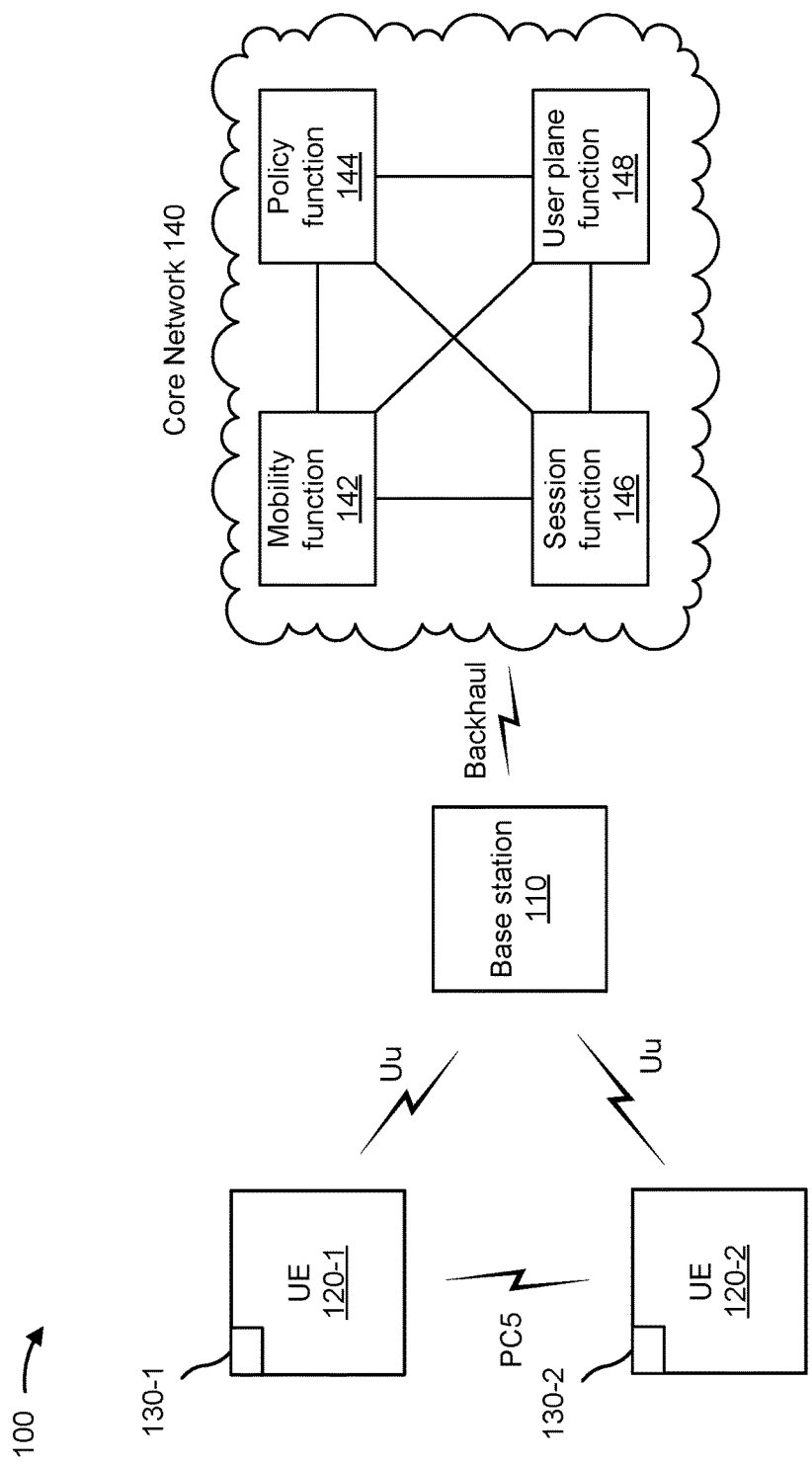
FIG. 1 is a diagram illustrating an example environment in which a haptic system described herein may be implemented, in accordance with various aspects of the present disclosure.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

A user equipment (UE) may use a haptic system to produce one or more vibrational patterns that provide tactile confirmations, alerts, or other messages to a user. One common haptic system includes a linear resonant actuator (LRA). An LRA may drive a magnetic mass (e.g., by generating alternating currents through one or more coils) that is connected to a spring or other tethering component. Accordingly, the motion of the magnetic mass causes a vibration of the UE that the user can feel.

The LRA (e.g., the coil thereof) may be configured with an impedance such that a driving voltage results in a magnetic field that moves the magnetic mass. If the impedance associated with the LRA is too low, this is generally indicative of a short circuit such that the driving voltage may damage an integrated circuit including the LRA and/or a circuit board including a haptic driver for the LRA. On the other hand, if the impedance associated with the LRA is too high, this is generally indicative of an open circuit such that the LRA will not function.

Generally, measurement of the impedance uses a voltage analog-to-digital converter (VADC) to measure a voltage across the LRA and an iSense current monitor to measure a current flowing through the LRA, such that the impedance may be determined. However, a VADC generally consumes large amounts of power (e.g., around 200 µA). Similarly, an iSense monitor generally consumes even more power (e.g., around 500 µA). Additionally, the VADC and iSense monitor require a large layout area (e.g., around 1 mm$^2$) and require precise calibration in order to produce accurate estimates of the impedance.

Some implementations described herein provide a mechanism to measure impedance associated with an LRA with significantly less power consumption and circuitry area than the VADC and the iSense monitor. Additionally, the mechanisms described herein may be more accurate, as well as less prone to calibration errors, than the VADC and the iSense monitor.

FIG. 1 is a diagram of an example environment 100 in which systems and/or methods described herein may be implemented. As shown in FIG. 1, environment 100 may include a base station 110, one or more UEs (e.g., UE 120-1 and UE 120-2 in example 100), and a core network 140. Devices of environment 100 may interconnect via wired connections (e.g., base station 110 connects to core network 140 via a wired backhaul), wireless connections (e.g., UEs 120-1 and 120-2 may connect to base station 110 via an over-the-air (OTA) interface, such as a Uu interface, and/or UEs 120-1 and 120-2 may connect to each other via a sidelink interface, such as a PC5 interface), or a combination of wired and wireless connections (e.g., base station 110 may connect to core network 140 via a wireless backhaul in addition to or in lieu of a wired backhaul).

UEs 120-1 and 120-2 may each include a communication device and/or a computing device. For example, the UEs 120-1 and 120-2 may each include a wireless communication device, a mobile phone, a user equipment, a laptop computer, a tablet computer, a desktop computer, a gaming console, a set-top box, a wearable communication device (e.g., a smart wristwatch, a pair of smart eyeglasses, a head mounted display, or a virtual reality headset), or a similar type of device. As shown in FIG. 1, UE 120-1 may further include a haptic system 130-1, and UE 120-2 may further include a haptic system 130-2. The haptic systems 130-1 and 130-2 may communicate information tactilely to users of UEs 120-1 and 120-2, respectively. In some implementations, the haptic system 130-1 and/or the haptic system 130-2 may include a mechanism for determining impedance across a haptic load, as described elsewhere herein.

Base station 110 may include one or more devices capable of communicating with UEs 120-1 and 120-2 and may also be referred to as a New Radio (NR) BS, a Node B, a gNB, a 5G node B (NB), an access point, a transmit receive point (TRP), or other similar term. Additionally, base station 110 may include one or more devices capable of receiving coordination and control signals from core network 140 via a backhaul. Base station 110 may provide communication coverage for a particular geographic area. In standards promulgated by the Third Generation Partnership Project (3GPP), the term "cell" can refer to a coverage area of a BS and/or a BS subsystem serving this coverage area, depending on the context in which the term is used. In some implementations, base station 110 may provide communication coverage for a macro cell, a pico cell, a femto cell, and/or another type of cell. A macro cell may cover a relatively large geographic area (e.g., several kilometers in radius) and may allow unrestricted access by UEs with service subscription. A pico cell may cover a relatively small geographic area and may allow unrestricted access by UEs with service subscription. A femto cell may cover a relatively small geographic area (e.g., a home) and may allow restricted access by UEs having association with the femto cell (e.g., UEs in a closed subscriber group (CSG)). A BS for a macro cell may be referred to as a macro BS. A BS for a pico cell may be referred to as a pico BS. A BS for a femto cell may be referred to as a femto BS or a home BS.

Core network 140 may include a telecommunications core network, such as a 5G next generation core network (NG Core), a Long Term Evolution (LTE) evolved packet core (EPC), and/or other similar telecommunications core networks. Core network 140 may include one or more devices capable of performing a mobility function 142 (e.g., an access and mobility function (AMF)), a policy function 144 (e.g., a policy control function (PCF)), a session function 146 (e.g., a session management function (SMF)), a user plane function 148 (e.g., a UPF), and/or other similar core network functions. The mobility function 142 may provide authentication and authorization of UEs (e.g., UEs 120-1 and 120-2) and mobility management for those UEs. The policy function 144 may provide a policy framework that incorporates network slicing, roaming, packet processing, mobility management, and/or other core network operations. The session function 146 may provide establishment, modification, and release of communication sessions in a wireless telecommunications system supported by the core network 140. For example, the session function 146 may configure traffic steering policies at the user plane function 148 and/or enforce Internet protocol (IP) address allocation and policies. In some implementations, the mobility function 142 and the session function 146 may be termination points for non-access stratum (NAS) signaling (e.g., from UEs 120-1 and 120-2). The user plane function 148 may be an anchor point for intra-/inter-radio access technology (RAT) mobility. For example, the user plane function 148 may apply rules to packets, such as rules pertaining to packet routing, traffic reporting, and/or handling user plane QoS, and may determine an attribute of application-specific data that is communicated (e.g., to the UEs 120-1 and 120-2) in a communication session.

The number and arrangement of devices and networks shown in FIG. 1 are provided as an example. In practice, there may be additional devices and/or networks, fewer devices and/or networks, different devices and/or networks, or differently arranged devices and/or networks than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2:
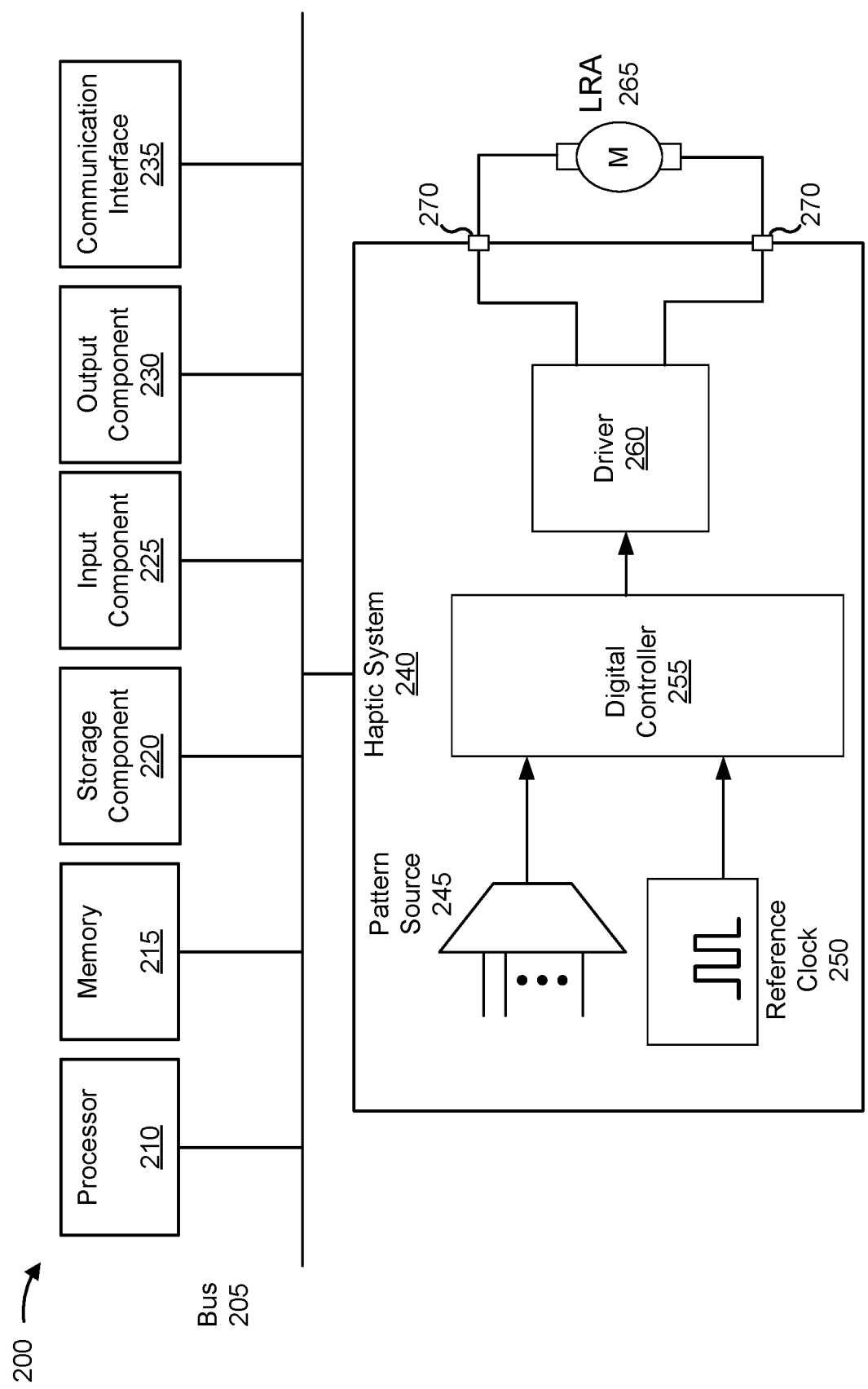
FIG. 2 is a diagram illustrating example components of one or more devices shown in FIG. 1, such as a haptic system, in accordance with various aspects of the present disclosure.

FIG. 2 is a diagram illustrating example components of a device 200, in accordance with various aspects of the present disclosure. Device 200 may correspond to UE 120-1 and/or UE 120-2. In some aspects, UE 120-1 and/or UE 120-2 may include one or more devices 200 and/or one or more components of device 200. As shown in FIG. 2, device 200 may include a bus 205, a processor 210, a memory 215, a storage component 220, an input component 225, an output component 230, a communication interface 235, a haptic system 240, and/or other similar components.

Bus 205 includes a component that permits communication among the components of device 200. Processor 210 is implemented in hardware, firmware, or a combination of hardware and software. Processor 210 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some aspects, processor 210 includes one or more processors capable of being programmed to perform a function. Memory 215 includes a random access memory (RAM), a read only memory (ROM), and/or another type of dynamic or static storage device (e.g., a flash memory, a magnetic memory, and/or an optical memory) that stores information and/or instructions for use by processor 210.

Storage component 220 stores information and/or software related to the operation and use of device 200. For example, storage component 220 may include a hard disk (e.g., a solid state disk), a flash memory, a random access memory (RAM), and/or another type of non-transitory computer-readable medium, along with a corresponding drive.

Input component 225 includes a component that permits device 200 to receive information, such as via user input (e.g., a touch screen display, a keyboard, a keypad, a mouse, a button, a switch, and/or a microphone). Additionally, or alternatively, input component 225 may include a component for determining a position or a location of device 200 (e.g., a global positioning system (GPS) component, a global navigation satellite system (GNSS) component, and/or the like), a sensor for sensing information (e.g., an accelerometer, a gyroscope, an actuator, another type of position or environment sensor, and/or the like)). Output component 230 includes a component that provides output information from device 200 (e.g., a display, a speaker, a haptic feedback component, an audio or visual indicator, and/or the like).

Communication interface 235 includes a transceiver-like component (e.g., a transceiver and/or a separate receiver and transmitter) that enables device 200 to communicate with other devices, such as via a wired connection, a wireless connection, or a combination of wired and wireless connections. Communication interface 235 may permit device 200 to receive information from another device and/or provide information to another device. For example, communication interface 235 may include an Ethernet interface, an optical interface, a coaxial interface, an infrared interface, a radio frequency interface, a universal serial bus (USB) interface, a wireless local area interface (e.g., a Wi-Fi interface), a cellular network interface, and/or the like.

Haptic system 240 may correspond to haptic system 130-1 and/or haptic system 130-2. In some aspects, haptic system 130-1 and/or haptic system 130-2 may include one or more haptic systems 240 and/or one or more components of haptic system 240. Haptic system 240 may include a pattern source 245 that generates an analog and/or digital signal encoding data that indicates a vibrational pattern to be communicated to a user. Additionally, haptic system 240 may include a reference clock 250, such as a quartz piezoelectric oscillator, a tank circuit, and/or another circuit configured to generate a clock signal. Accordingly, a digital controller 255 may generate analog and/or digital signals encoding instructions for driving a haptic mass (M) according to the vibrational pattern. Driver 260 may generate one or more voltages for driving the haptic mass M of an LRA 265 or other similar haptic engine. In some implementations, the haptic system 240 may further include a mechanism 270 for determining impedance across the haptic load (e.g., the haptic mass M), as described elsewhere herein.

Device 200 may perform one or more processes described herein. Device 200 may perform these processes based on processor 210 executing software instructions stored by a non-transitory computer-readable medium, such as memory 215 and/or storage component 220. A computer-readable medium is defined herein as a non-transitory memory device. A memory device includes memory space within a single physical storage device or memory space spread across multiple physical storage devices.

Software instructions may be read into memory 215 and/or storage component 220 from another computer-readable medium or from another device via communication interface 235. When executed, software instructions stored in memory 215 and/or storage component 220 may cause processor 210 to perform one or more processes described herein. Additionally, or alternatively, hardwired circuitry may be used in place of or in combination with software instructions to perform one or more processes described herein. Thus, aspects described herein are not limited to any specific combination of hardware circuitry and software.

In some aspects, device 200 includes means for performing one or more processes described herein and/or means for performing one or more operations of the processes described herein. For example, device 200 may include means for driving a first node of a haptic load; and/or means for triggering a first comparator when a voltage driving the haptic load satisfies a first condition. In some aspects, such means may include one or more components of device 200 described in connection with FIG. 2, such as bus 205, processor 210, memory 215, storage component 220, input component 225, output component 230, communication interface 235, haptic system 240, and/or other similar components. Additionally, or alternatively, device 200 may include means for driving a first node of a haptic load; and/or means for outputting, using a first analog-to-digital converter, a first ratio associated with an impedance of the haptic load. In some aspects, such means may include one or more components of device 200 described in connection with FIG. 2, such as bus 205, processor 210, memory 215, storage component 220, input component 225, output component 230, communication interface 235, haptic system 240, and/or other similar components.

The number and arrangement of components shown in FIG. 2 are provided as an example. In practice, device 200 may include additional components, fewer components, different components, or differently arranged components than those shown in FIG. 2. Additionally, or alternatively, a set of components (e.g., one or more components) of device 200 may perform one or more functions described as being performed by another set of components of device 200.

Figure 3A:
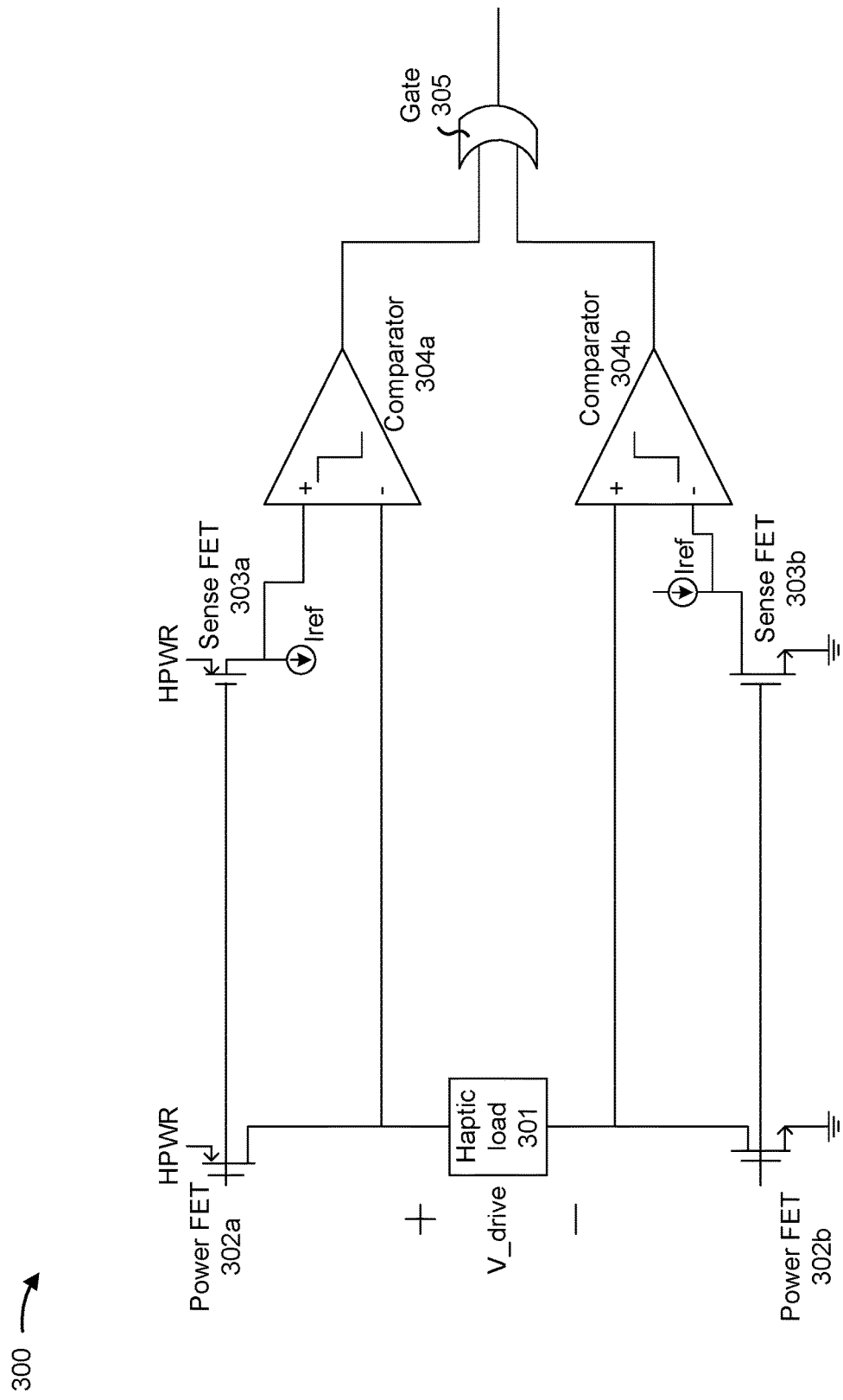
FIGS. 3A, 3B, and 3C are diagrams illustrating examples associated with statically detecting impedance of a haptic load, in accordance with various aspects of the present disclosure.

FIG. 3A is a diagram illustrating an example measurement circuit 300 associated with statically detecting impedance of a haptic load, in accordance with various aspects of the present disclosure. As shown in FIG. 3A, example 300 includes a haptic load 301 (e.g., haptic mass M as described in connection with FIG. 2) that is driven by a voltage V_drive. Accordingly, the haptic load 301 is associated with a first node (a "+" node as shown in FIG. 3A) and a second node (a "−" node as shown in FIG. 3A) across which V_drive will be applied. In some implementations, the haptic load may include an LRA, as described above in connection with FIG. 2.

In example 300, at least one first transistor 302a may be configured to drive a first node of the haptic load 301. Accordingly, a drain of the at least one first transistor 302a may be connected to the first node of the haptic load 301. In some implementations, the at least one first transistor 302a may comprise a power field-effect transistor (FET). As shown in FIG. 3A, a source of the at least one first transistor 302a may be connected to a power source (e.g., a hold power (HPWR) voltage and/or another voltage). Additionally, example 300 includes at least one second transistor 303a that has a gate connected to a gate of the at least one first transistor 302a and a drain connected to a first reference current (shown as "Iref" in FIG. 3A). In some implementations, the at least one second transistor 303a may comprise a sense field-effect transistor (FET). For example, a sense FET may mirror a load current (e.g., a current though the at least one first transistor 302a) to a sense current (e.g., a current though the at least one second transistor 303a) for measurement. As shown in FIG. 3A, a source of the at least one second transistor 303a may be connected to a power source (e.g., an HPWR voltage and/or another voltage). The at least one second transistor 303a may be connected to a same power source as the at least one first transistor 302a or may be connected to a different power source.

Example 300 further includes a first comparator 304a that has a first node connected, in parallel, to the drain of the at least one second transistor 303a and a second node connected to the first node of the haptic load 301. The first comparator 304a may be configured to trigger when a voltage driving the haptic load 301 satisfies a first condition. For example, the first comparator 304a may output a signal when the voltage driving the haptic load 301 is greater than or equal to a product of an impedance associated with the haptic load 301, the first reference current, and a sense ratio associated with the at least one first transistor 302a and at least one second transistor 303a. For example, the sense ratio may be based at least in part on a ratio between a current through the at least one first transistor 302a and a current through the at least one second transistor 303a. In some implementations, the sense ratio may be on the order of 1000:1.

As further shown in FIG. 3A, example 300 may include at least one third transistor 302b configured to drive a second node of the haptic load 301. Accordingly, a drain of the at least one third transistor 302b may be connected to the second node of the haptic load 301. In some implementations, the at least one third transistor 302b may comprise a power FET. As shown in FIG. 3A, a source of the at least one third transistor 302b may be connected to a ground. Additionally, example 300 may include at least one fourth transistor 303b that has a gate connected to a gate of the at least one third transistor 302b and a drain connected to a second reference current (shown as "Iref" in FIG. 3A). The second reference current may be equal to the first reference current or may be different. In some implementations, the at least one fourth transistor 303b may comprise a sense FET. As shown in FIG. 3A, a source of the at least one fourth transistor 303b may be connected to a ground. The at least one fourth transistor 303b may be connected to a same ground as the at least one second transistor 303a or may be connected to a different ground.

Example 300 may further include a second comparator 304b that has a first node connected, in parallel, to the drain of the at least one fourth transistor 303b and a second node connected to the second node of the haptic load 301. The second comparator 304b may be configured to trigger when a voltage driving the haptic load 301 satisfies a second condition. For example, the second comparator 304b may output a signal when the voltage driving the haptic load 301 is greater than or equal to a product of an impedance associated with the haptic load 301, the second reference current, and a sense ratio associated with the at least one third transistor 302b and at least one fourth transistor 303b. For example, the sense ratio may be based at least in part on a ratio between a current through the at least one third transistor 302b and a current through the at least one fourth transistor 303b. In some implementations, the sense ratio may be on the order of 1000:1.

In some implementations, as shown in FIG. 3A, example 300 may include a gate 305 connected to the first comparator 304a and the second comparator 304b. The gate 305 may be configured to combine an output from the first comparator 304a with an output from the second comparator 304b. For example, gate 305 may comprise an OR gate such that an output from example 300 indicates whether the first comparator 304a and/or the second comparator 304b triggered. As an alternative, gate 305 may comprise an AND gate such that an output from example 300 indicates whether the first comparator 304a and the second comparator 304b triggered.

In some implementations, example 300 may further include a microprocessor configured (e.g., programmed and/or otherwise configured) to determine an impedance associated with the haptic load 301 based at least in part on the voltage driving the haptic load 301, an output from the first comparator 304a, the first reference current, and a sense ratio associated with the at least one second transistor 303a. For example, when the first comparator 304a triggers (e.g., determined based at least in part on output from the gate 305), the microprocessor may calculate the impedance as less than or equal to an expression of the form $$\frac{V\_drive}{Iref \cdot N},$$

where V_drive represents the voltage driving the haptic load 301, Iref represents the first reference current, and N represents the sense ratio associated with the at least one second transistor 303a.

Additionally, or alternatively, the microprocessor may be configured (e.g., programmed and/or otherwise configured) to determine an impedance associated with the haptic load 301 based at least in part on the voltage driving the haptic load 301, an output from the second comparator 304b, the second reference current, and a sense ratio associated with the at least one fourth transistor 303b. For example, when the second comparator 304b triggers (e.g., determined based at least in part on output from the gate 305), the microprocessor may calculate the impedance as less than or equal to an expression of the form $$\frac{V\_drive}{Iref \cdot N},$$

where V_drive represents the voltage driving the haptic load 301, Iref represents the second reference current, and N represents the sense ratio associated with the at least one fourth transistor 303b.

In some implementations, the microprocessor may further compare output from the first comparator 304a and the second comparator 304b and determine, based at least in part on the comparison, whether the first comparator 304a or the second comparator 304b is defective. For example, the microprocessor may determine that the first comparator 304a is defective when the output from the first comparator 304a does not correspond to (e.g., is more frequent than or less frequent than) the output from the second comparator 304b. Similarly, the microprocessor may determine that the second comparator 304b is defective when the output from the second comparator 304b does not correspond to (e.g., is more frequent than or less frequent than) the output from the first comparator 304a.

In some implementations, the microprocessor may compare the impedance, associated with the haptic load 301, to at least one threshold. For example, the at least one threshold may include one threshold associated with a short circuit (e.g., 2Ω) and another threshold associated with an open circuit (e.g., 40Ω). The microprocessor may generate an error signal when the impedance satisfies the at least one threshold. For example, the microprocessor may output a signal indicative of a short circuit, an open circuit, and/or another problem.

In order to determine whether the first comparator 304a and/or the second comparator 304b triggers at different drive voltages, the microprocessor may be configured to sweep a plurality of voltages driving the haptic load 301. For example, the microprocessor may generate one or more control signals that cause a controller and/or driver (e.g., controller 255 and/or driver 260 of FIG. 2) associated with the haptic load 301 to generate different driving voltages (shown as V_drive in FIG. 3A). Accordingly, the microprocessor may determine an impedance, associated with the haptic load 301, based at least in part on a binary search using the plurality of voltages. For example, the microprocessor may detect that the first comparator 304a and/or the second comparator 304b triggers at a 50% duty cycle such that the impedance is less than or equal to 20Ω, then detect that the first comparator 304a and/or the second comparator 304b triggers at a 25% duty cycle such that the impedance is less than or equal to 10Ω, then detect that the first comparator 304a and/or the second comparator 304b does not trigger at a 12.5% duty cycle such that the impedance is greater than or equal to 5Ω, and then detect that the first comparator 304a and/or the second comparator 304b does not trigger at an 18.75% duty cycle such that the impedance is greater than or equal to 7.5Ω. In another example, the microprocessor may further detect that the first comparator 304a and/or the second comparator 304b does not trigger at a 21.875% duty cycle such that the impedance is greater than or equal to 8.75Ω. Accordingly, the microprocessor may use a binary search to identify a range of impedances associated with the haptic load 301.

Additionally, or alternatively, the microprocessor may be configured to sweep a plurality of first reference currents for the at least one second transistor 303a and/or a plurality of second reference currents for the at least one fourth transistor 303b. For example, the microprocessor may generate one or more control signals that cause a current source associated with the at least one second transistor 303a and/or a current source associated with the at least one fourth transistor 303b to generate different first reference currents and/or second reference currents (shown as Iref in FIG. 3A), respectively. Accordingly, the microprocessor may determine an impedance, associated with the haptic load 301, based at least in part on a binary search using the plurality of reference currents. Therefore, similar to the binary search described above in connection with V_drive, the microprocessor may use a binary search of reference currents to identify a range of impedances associated with the haptic load 301.

Additionally, or alternatively, the microprocessor may be configured to sweep a plurality of sensing ratios associated with the at least one second transistor 303a and/or a plurality of sensing ratios associated with the at least one fourth transistor 303b. For example, the microprocessor may generate one or more control signals that cause the at least one second transistor 303a and/or the at least one fourth transistor 303b to generate different mirror currents and thus different sensing ratios with respect to the at least one first transistor 302a and/or the at least one third transistor 302b, respectively. Accordingly, the microprocessor may determine an impedance, associated with the haptic load 301, based at least in part on a binary search using the plurality of sensing ratios. Therefore, similar to the binary search described above in connection with V_drive, the microprocessor may use a binary search of sensing ratios to identify a range of impedances associated with the haptic load 301.

As an alternative, in some implementations, the microprocessor may be configured to use a voltage waveform to drive the haptic load 301. For example, the microprocessor may generate one or more control signals that cause a controller and/or driver (e.g., controller 255 and/or driver 260 of FIG. 2) associated with the haptic load 301 to generate the voltage waveform. In some implementations, the voltage waveform may comprise a sine wave or a triangular wave. Accordingly, the microprocessor may determine an impedance, associated with the haptic load 301, based at least in part on a trigger point that is associated with the voltage waveform and that is determined based at least in part on an output of the first comparator 304a and/or the second comparator 304b. For example, the first comparator 304a and/or the second comparator 304b may first output a signal, during a rising portion of the voltage waveform, when a value of V_drive corresponds to the impedance associated with haptic load 301. Accordingly, the microprocessor may map the output of the first comparator 304a and/or the second comparator 304b to the value of the voltage waveform at that time such that the microprocessor may determine the impedance without a binary search (as described above). In some implementations, the voltage waveform may have a frequency of approximately 200 Hz (e.g., within 10% of 200 Hz) such that the first comparator 304a and/or the second comparator 304b may be slower while still providing an accurate output for determining the impedance associated with haptic load 301.

The mechanisms described in connection with FIG. 3A may measure impedance associated with the haptic load 301 with significantly less power consumption and circuitry area than existing mechanisms. Additionally, the mechanisms described in connection with FIG. 3A may be more accurate as well as less prone to calibration errors than existing mechanisms.

As indicated above, FIG. 3A is provided as an example. Other examples may differ from what is described with respect to FIG. 3A.

Figure 3B:
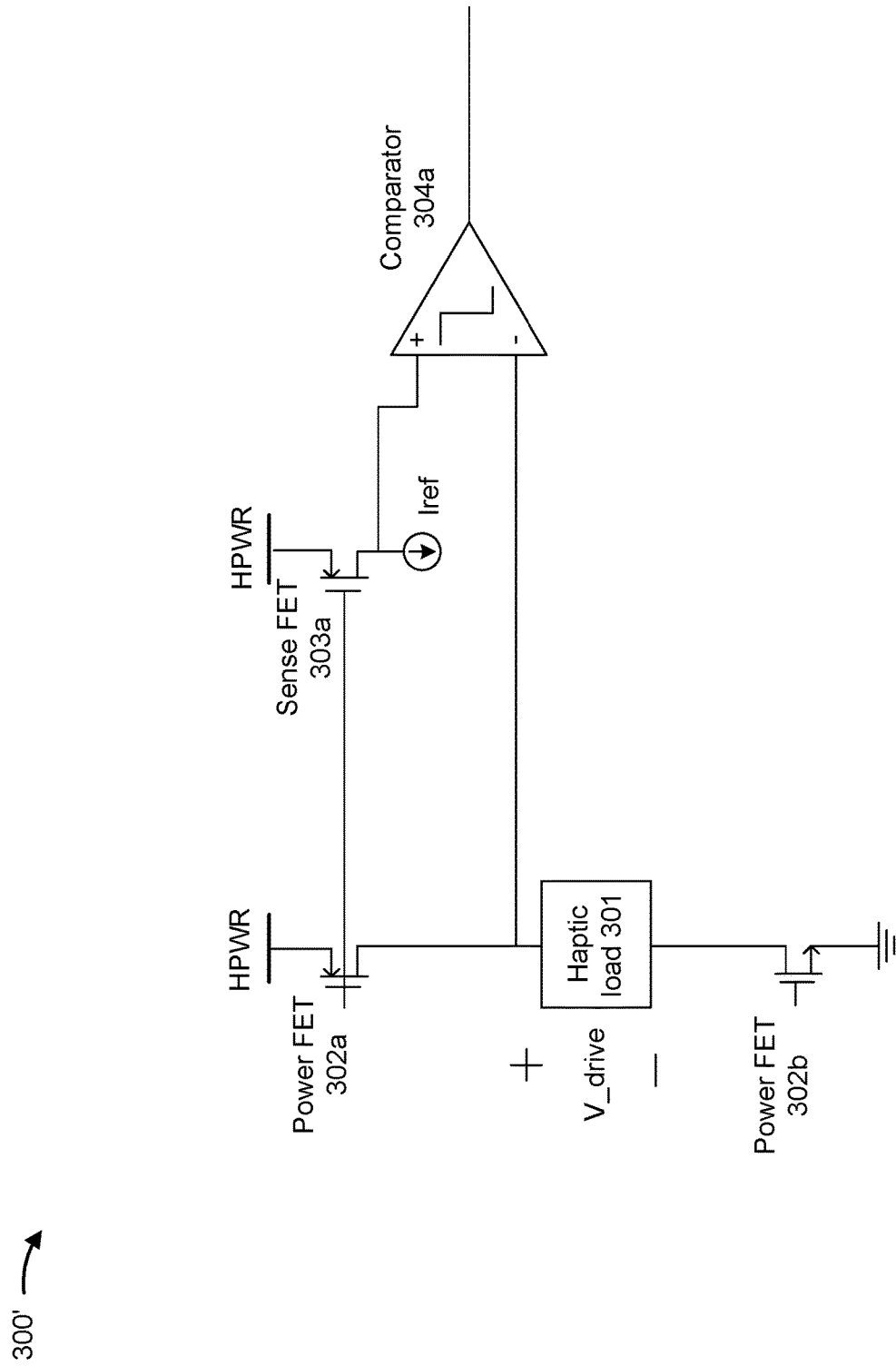

FIG. 3B is a diagram illustrating another example measurement circuit 300' associated with statically detecting impedance of a haptic load, in accordance with various aspects of the present disclosure. Example 300' is similar to example 300 and includes a haptic load 301 (e.g., haptic mass M as described in connection with FIG. 2) that is driven by a voltage V_drive and that is associated with a first node (a "+" node as shown in FIG. 3B) and a second node (a "−" node as shown in FIG. 3B). In some implementations, the haptic load may include an LRA, as described above in connection with FIG. 2.

Example 300' also includes at least one first transistor 302a, at least one second transistor 303a, and first comparator 304a, as described above in connection with FIG. 3A.

Example 300' further includes at least one third transistor 302b that drives the second node of the haptic load 301, but does not include at least one fourth transistor (e.g., another sense FET) connected to the at least one third transistor 302b. Accordingly, example 300' does not include agate and instead a microprocessor may use the output of the first comparator 304a directly. For example, a microprocessor may use a binary search and/or a voltage waveform (e.g., as described above in connection with FIG. 3A) to determine an impedance (or a range of impedances) associated with the haptic mass 301. However, the microprocessor will use the output from the first comparator 304a and not from a gate.

The mechanisms described in connection with FIG. 3B may measure impedance associated with the haptic load 301 with significantly less power consumption and circuitry area than existing mechanisms. Additionally, the mechanisms described in connection with FIG. 3B may use less circuitry area than the mechanisms described in connection with FIG. 3A.

As indicated above, FIG. 3B is provided as an example. Other examples may differ from what is described with respect to FIG. 3B.

Figure 3C:
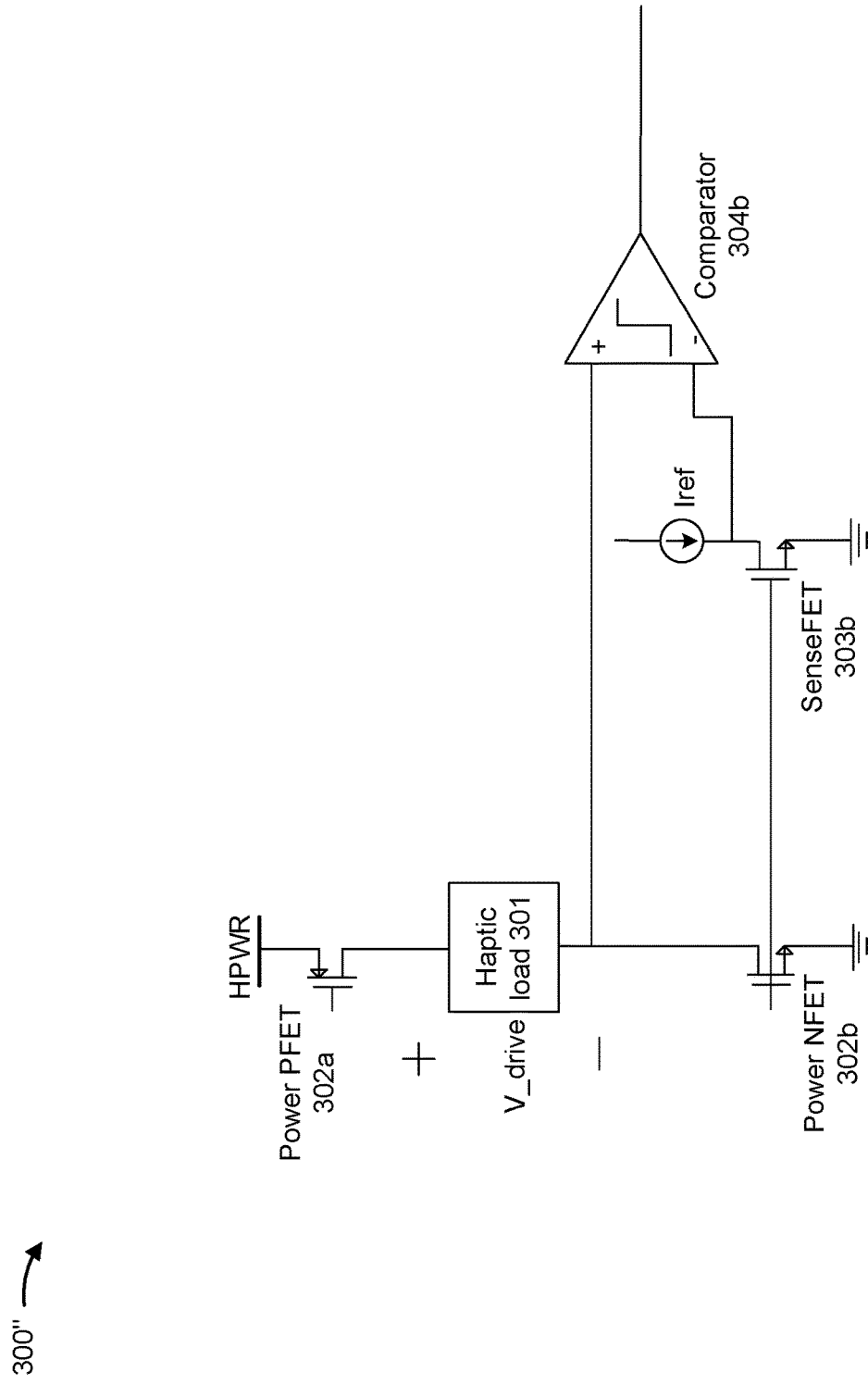

FIG. 3C is a diagram illustrating another example measurement circuit 300" associated with statically detecting impedance of a haptic load, in accordance with various aspects of the present disclosure. Example 300" is similar to example 300 and includes a haptic load 301 (e.g., haptic mass M as described in connection with FIG. 2) that is driven by a voltage V_drive and that is associated with a first node (a "+" node as shown in FIG. 3C) and a second node (a "−" node as shown in FIG. 3C). In some implementations, the haptic load may include an LRA, as described above in connection with FIG. 2.

Example 300" also includes at least one third transistor 302b, at least one fourth transistor 303b, and a second comparator 304b, as described above in connection with FIG. 3A. Example 300" further includes at least one first transistor 302a that drives the first node of the haptic load 301 but does not include at least one second transistor (e.g., another sense FET) connected to the at least one first transistor 302a. Accordingly, example 300" does not include a gate and instead a microprocessor may use the output of the second comparator 304b directly. For example, a microprocessor may use a binary search and/or a voltage waveform (e.g., as described above in connection with FIG. 3A) to determine an impedance (or a range of impedances) associated with the haptic mass 301. However, the microprocessor will use the output from the second comparator 304b and not from a gate.

The mechanisms described in connection with FIG. 3C may measure impedance associated with the haptic load 301 with significantly less power consumption and circuitry area than existing mechanisms. Additionally, the mechanisms described in connection with FIG. 3C may use less circuitry area than the mechanisms described in connection with FIG. 3A.

As indicated above, FIG. 3C is provided as an example. Other examples may differ from what is described with respect to FIG. 3C.

Figure 4A:
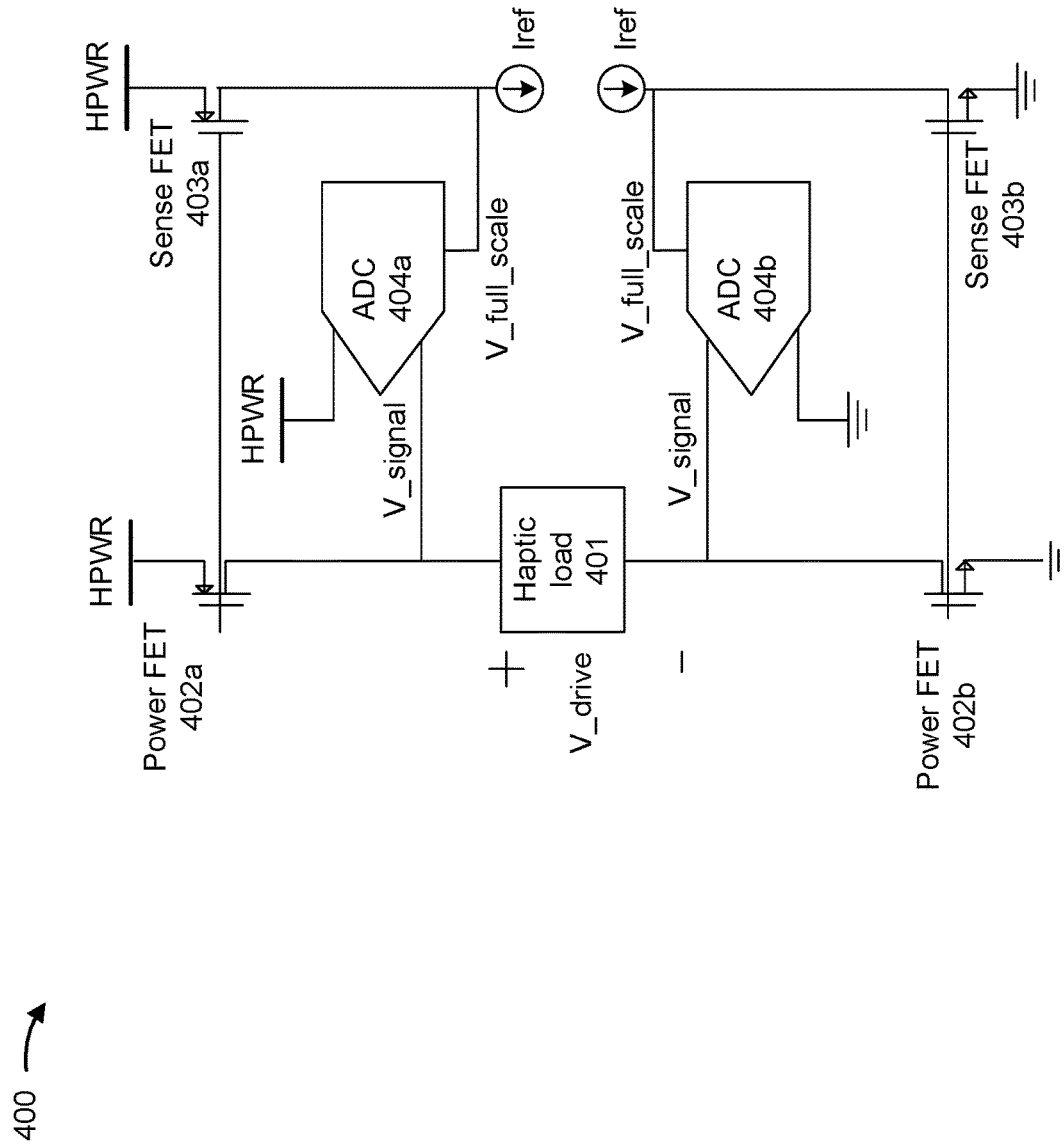
FIGS. 4A, 4B, and 4C are diagrams illustrating examples associated with dynamically detecting impedance of a haptic load, in accordance with various aspects of the present disclosure.

FIG. 4A is a diagram illustrating an example measurement circuit 400 associated with dynamically detecting impedance of a haptic load, in accordance with various aspects of the present disclosure. As shown in FIG. 4A, example 400 includes a haptic load 301 (e.g., haptic mass M as described in connection with FIG. 2) that is driven by a voltage V_drive. Accordingly, the haptic load 401 is associated with a first node (a "+" node as shown in FIG. 4A) and a second node (a "−" node as shown in FIG. 4A) across which V_drive will be applied. In some implementations, the haptic load may include an LRA, as described above in connection with FIG. 2.

In example 400, at least one first transistor 402a may be configured to drive a first node of the haptic load 401. Accordingly, a drain of the at least one first transistor 402a may be connected to the first node of the haptic load 401. In some implementations, the at least one first transistor 402a may comprise a power FET. As shown in FIG. 4A, a source of the at least one first transistor 402a may be connected to a power source (e.g., an HPWR voltage and/or another voltage). Additionally, example 400 includes at least one second transistor 403a that has a gate connected to a gate of the at least one first transistor 402a and a drain connected to a first reference current (shown as "Iref" in FIG. 4A). In some implementations, the at least one second transistor 403a may comprise a sense FET. As shown in FIG. 4A, a source of the at least one second transistor 403a may be connected to a power source (e.g., an HPWR voltage and/or another voltage). The at least one second transistor 403a may be connected to a same power source as the at least one first transistor 402a or may be connected to a different power source.

Example 400 further includes a first analog-to-digital converter (ADC) 404a that has a first node connected, in parallel, to the drain of the at least one second transistor 403a and a second node connected to the first node of the haptic load 401. The first ADC 404a may be configured to output a first ratio associated with an impedance of the haptic load 401. For example, the ADC 404a may output a signal of the form:

$$\text{ADC\_ratio} = \frac{I_{LRA}}{Iref \cdot N} = \frac{V\_signal}{V\_full\_scale}$$

where ADC_ratio represents the first ratio, $I_{LRA}$ represents a current through the haptic load 401, Iref represents the first reference current, N represents a sense ratio associated with the at least one second transistor 403a (e.g., similar to the sense ratio associated with the at least one second transistor 303a as described above in connection with FIG. 3A), V_signal represents a magnitude of a voltage associated with a first input to the first ADC 404a as shown in FIG. 4A, and V_full_scale represents a magnitude of a voltage associated with a second input to the first ADC 404a as shown in FIG. 4A.

As further shown in FIG. 4A, example 400 may include at least one third transistor 402b configured to drive a second node of the haptic load 401. Accordingly, a drain of the at least one third transistor 402b may be connected to the second node of the haptic load 401. In some implementations, the at least one third transistor 402b may comprise a power FET. As shown in FIG. 4A, a source of the at least one third transistor 402b may be connected to a ground. Additionally, example 400 may include at least one fourth transistor 403b that has a gate connected to a gate of the at least one third transistor 402b and a drain connected to a second reference current (shown as "Iref" in FIG. 4A). The second reference current may be equal to the first reference current or may be different. In some implementations, the at least one fourth transistor 403b may comprise a sense FET. As shown in FIG. 4A, a source of the at least one fourth transistor 403b may be connected to a ground. The at least one fourth transistor 403b may be connected to a same ground as the at least one second transistor 403a or may be connected to a different ground.

Example 400 may further include a second ADC 404b that has a first node connected, in parallel, to the drain of the at least one fourth transistor 403b and a second node connected to the second node of the haptic load 401. The second ADC 404b may be configured to output a second ratio associated with an impedance of the haptic load 401. For example, the ADC 404b may output a signal of the form:

$$\text{ADC\_ratio} = \frac{I_{LRA}}{Iref \cdot N} = \frac{V\_signal}{V\_full\_scale}$$

where ADC_ratio represents the second ratio. $I_{LRA}$ represents a current through the haptic load 401, Iref represents the second reference current, N represents a sense ratio associated with the at least one fourth transistor 403b (e.g., similar to the sense ratio associated with the at least one fourth transistor 303b as described above in connection with FIG. 3A), V_signal represents a magnitude of a voltage associated with a first input to the second ADC 404b as shown in FIG. 4A, and V_full_scale represents a magnitude of a voltage associated with a second input to the second ADC 404b as shown in FIG. 4A. The sense ratio associated with the at least one fourth transistor 403b may be the same as or different than the sense ratio associated with the at least one second transistor 403a, and the second reference current may be equal or unequal to the first reference current. Generally, however, the magnitude of the voltage associated with the second input to the second ADC 404b will be the same as the magnitude of the voltage associated with the second input to the first ADC 404a.

In some implementations, example 400 may further include a microprocessor configured (e.g., programmed and/or otherwise configured) to determine an impedance of the haptic load 401 based at least in part on a voltage driving the haptic load 401 (shown as V_drive in FIG. 4A), the first ratio, the first reference current, and a sensing ratio associated with the at least one second transistor 403a. For example, the sense ratio may be based at least in part on a ratio between a current through the at least one first transistor 402a and a current through the at least one second transistor 403a. In some implementations, the sense ratio may be on the order of 1000:1. The microprocessor may calculate the impedance based at least part on an expression of the form $$R\_LRA = \frac{V\_drive}{Iref \cdot N \cdot ADC\_radio},$$

where V_drive represents the voltage driving the haptic load 401, Iref represents the first reference current, N represents the sense ratio associated with the at least one second transistor 403a, and ADC_ratio represents the first ratio.

Additionally, or alternatively, the microprocessor may be configured (e.g., programmed and/or otherwise configured) to determine an impedance of the haptic load 401 based at least in part on a voltage driving the haptic load 401 (shown as V_drive in FIG. 4A), the second ratio, the second reference current, and a sensing ratio associated with the at least one fourth transistor 403b. For example, the sense ratio may be based at least in part on a ratio between a current through the at least one third transistor 402b and a current through the at least one fourth transistor 403b. In some implementations, the sense ratio may be on the order of 1000:1. The microprocessor may calculate the impedance based at least part on an expression of the form $$R\_LRA = \frac{V\_drive}{Iref \cdot N \cdot ADC\_ratio},$$

where V_drive represents the voltage driving the haptic load 401, Iref represents the second reference current, N represents the sense ratio associated with the at least one fourth transistor 403b, and ADC_ratio represents the second ratio.

In some implementations, the microprocessor may further compare output from the first ADC 404a and the second ADC 404b and determine, based at least in part on the comparison, whether the first ADC 404a or the second ADC 404b is defective. For example, the microprocessor may determine that the first ADC 404a is defective when the output from the first ADC 404a does not correspond to (e.g., differs by more or less than a threshold amount from) the output from the second ADC 404b. Similarly, the microprocessor may determine that the second ADC 404b is defective when the output from the second ADC 404b does not correspond to (e.g., differs by more or less than a threshold amount from) the output from the first ADC 404a.

In some implementations, the microprocessor may compare the impedance of the haptic load 401 to at least one threshold. For example, the at least one threshold may include one threshold associated with a short circuit (e.g., 2Ω) and another threshold associated with an open circuit (e.g., 40Ω). The microprocessor may generate an error signal when the impedance satisfies the at least one threshold. For example, the microprocessor may output a signal indicative of a short circuit, an open circuit, and/or another problem.

The mechanisms described in connection with FIG. 4A may measure impedance associated with the haptic load 301 with significantly less power consumption and circuitry area than existing mechanisms. Additionally, the mechanisms described in connection with FIG. 4A may be faster and more accurate but also use more circuitry area than the mechanisms described in connection with FIGS. 3A-3C.

As indicated above, FIG. 4A is provided as an example. Other examples may differ from what is described with respect to FIG. 4A.

Figure 4B:
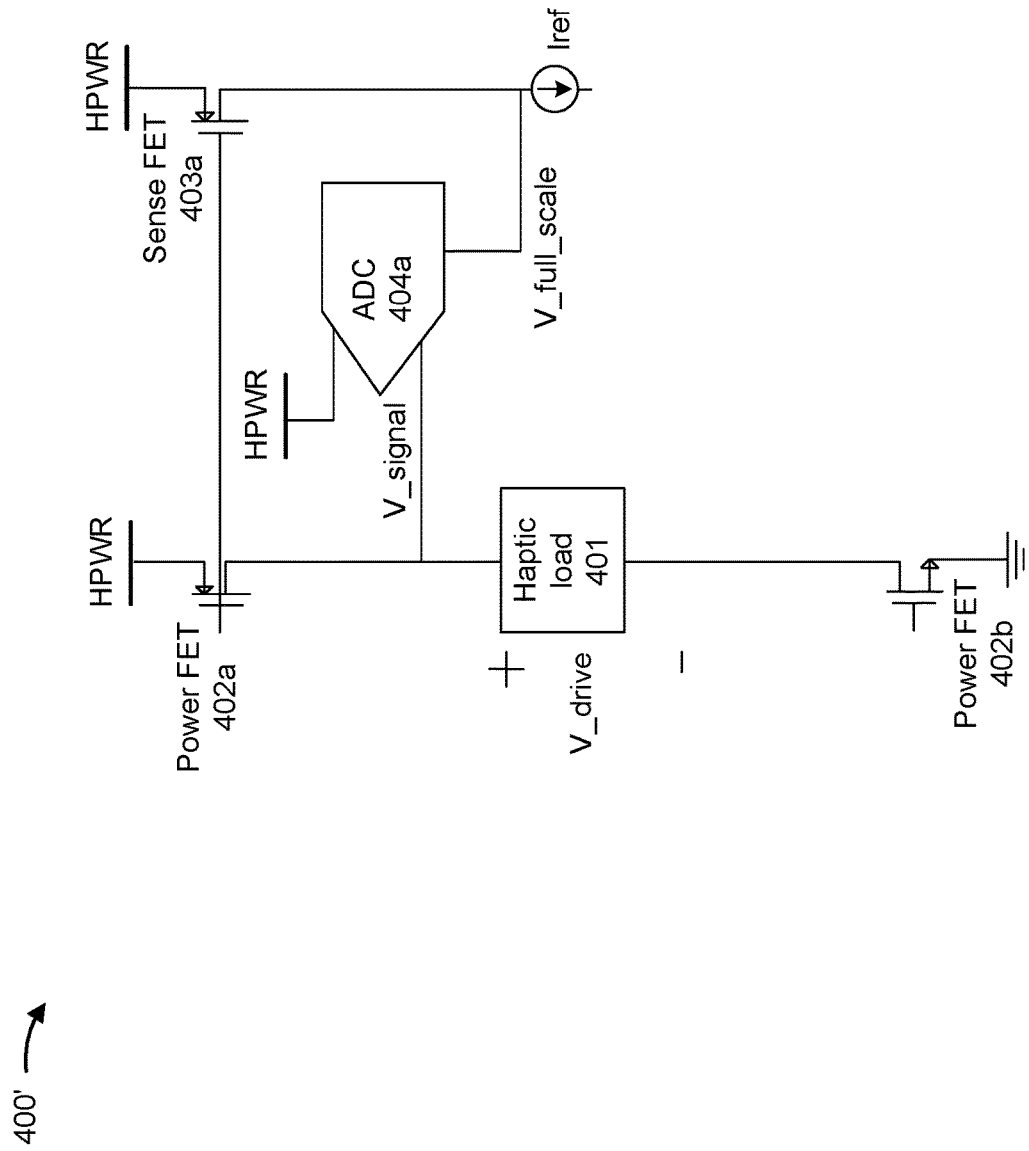

FIG. 4B is a diagram illustrating another example measurement circuit 400' associated with dynamically detecting impedance of a haptic load, in accordance with various aspects of the present disclosure. Example 400' is similar to example 400 and includes a haptic load 401 (e.g., haptic mass M as described in connection with FIG. 2) that is driven by a voltage V_drive and that is associated with a first node (a "+" node as shown in FIG. 4B) and a second node (a "−" node as shown in FIG. 4B). In some implementations, the haptic load may include an LRA, as described above in connection with FIG. 2.

Example 400' also includes at least one first transistor 402a, at least one second transistor 403a, and first ADC 404a, as described above in connection with FIG. 4A. Example 400' further includes at least one third transistor 402b that drives the second node of the haptic load 401, but does not include at least one fourth transistor (e.g., another sense FET) connected to the at least one third transistor 402b. Accordingly, example 400' does not include second ADC 404b and instead a microprocessor may receive only the first ratio output by the first ADC 404a. For example, the microprocessor may determine an impedance of the haptic mass 401 using the first ratio, as described above in connection with FIG. 4A.

The mechanisms described in connection with FIG. 4B may measure impedance associated with the haptic load 401 with significantly less power consumption and circuitry area than existing mechanisms. Additionally, the mechanisms described in connection with FIG. 4B may use less circuitry area than the mechanisms described in connection with FIG. 4A.

As indicated above, FIG. 4B is provided as an example. Other examples may differ from what is described with respect to FIG. 4B.

Figure 4C:
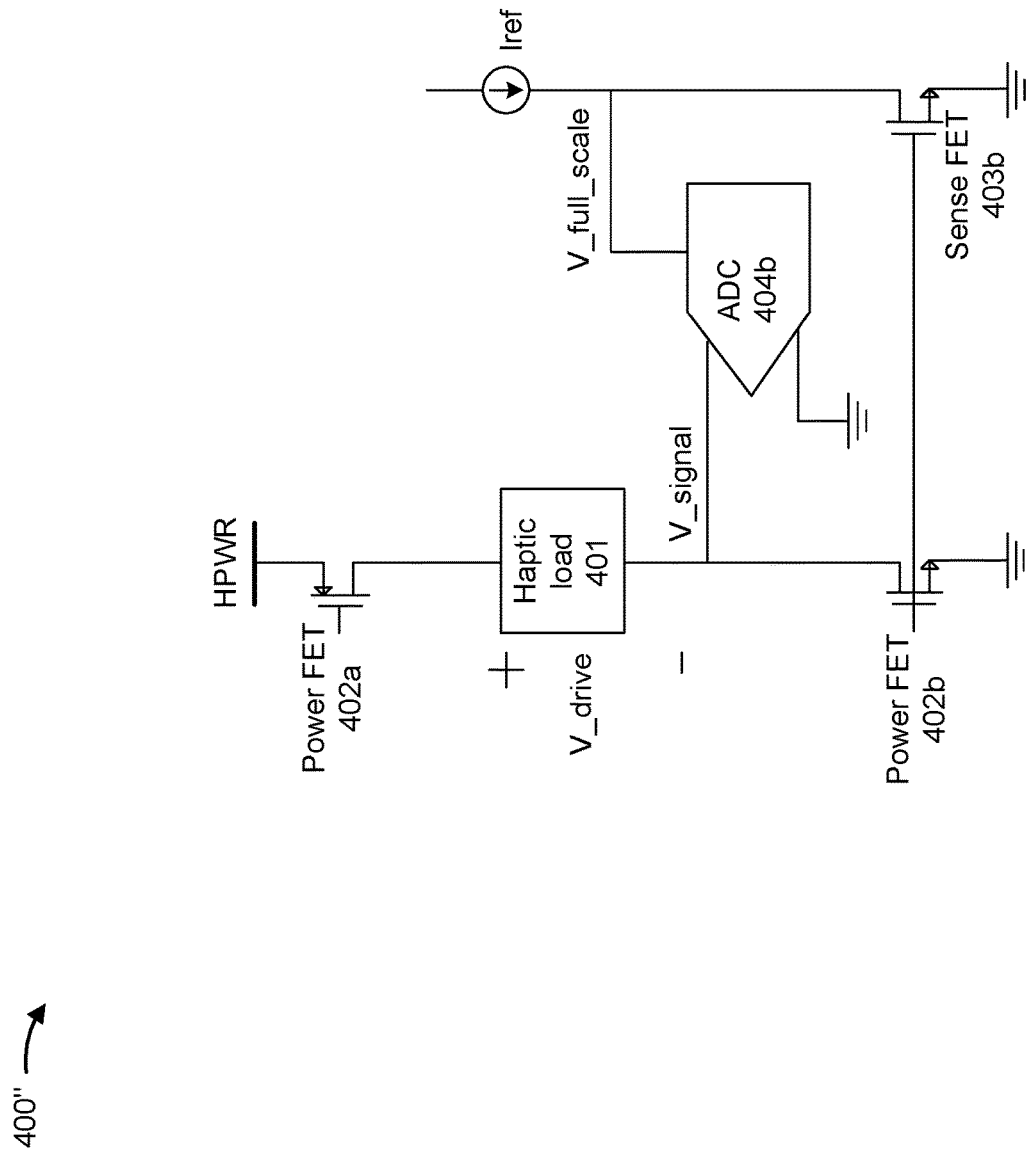

FIG. 4C is a diagram illustrating another example measurement circuit 400" associated with dynamically detecting impedance of a haptic load, in accordance with various aspects of the present disclosure. Example 400" is similar to example 400 and includes a haptic load 401 (e.g., haptic mass M as described in connection with FIG. 2) that is driven by a voltage V_drive and that is associated with a first node (a "+" node as shown in FIG. 4C) and a second node (a "−" node as shown in FIG. 4C). In some implementations, the haptic load may include an LRA, as described above in connection with FIG. 2.

Example 400" also includes at least one third transistor 402b, at least one fourth transistor 403b, and second ADC 404b, as described above in connection with FIG. 4A. Example 400" further includes at least one first transistor 402a that drives the first node of the haptic load 401, but does not include at least one second transistor (e.g., another sense FET) connected to the at least one first transistor 402a. Accordingly, example 400" does not include first ADC 404a and instead a microprocessor may receive only the second ratio output by the second ADC 404b. For example, the microprocessor may determine an impedance of the haptic mass 401 using the second ratio, as described above in connection with FIG. 4A.

The mechanisms described in connection with FIG. 4C may measure impedance associated with the haptic load 401 with significantly less power consumption and circuitry area than existing mechanisms. Additionally, the mechanisms described in connection with FIG. 4C may use less circuitry area than the mechanisms described in connection with FIG. 4A.

As indicated above, FIG. 4C is provided as an example. Other examples may differ from what is described with respect to FIG. 4C.

Figure 5:
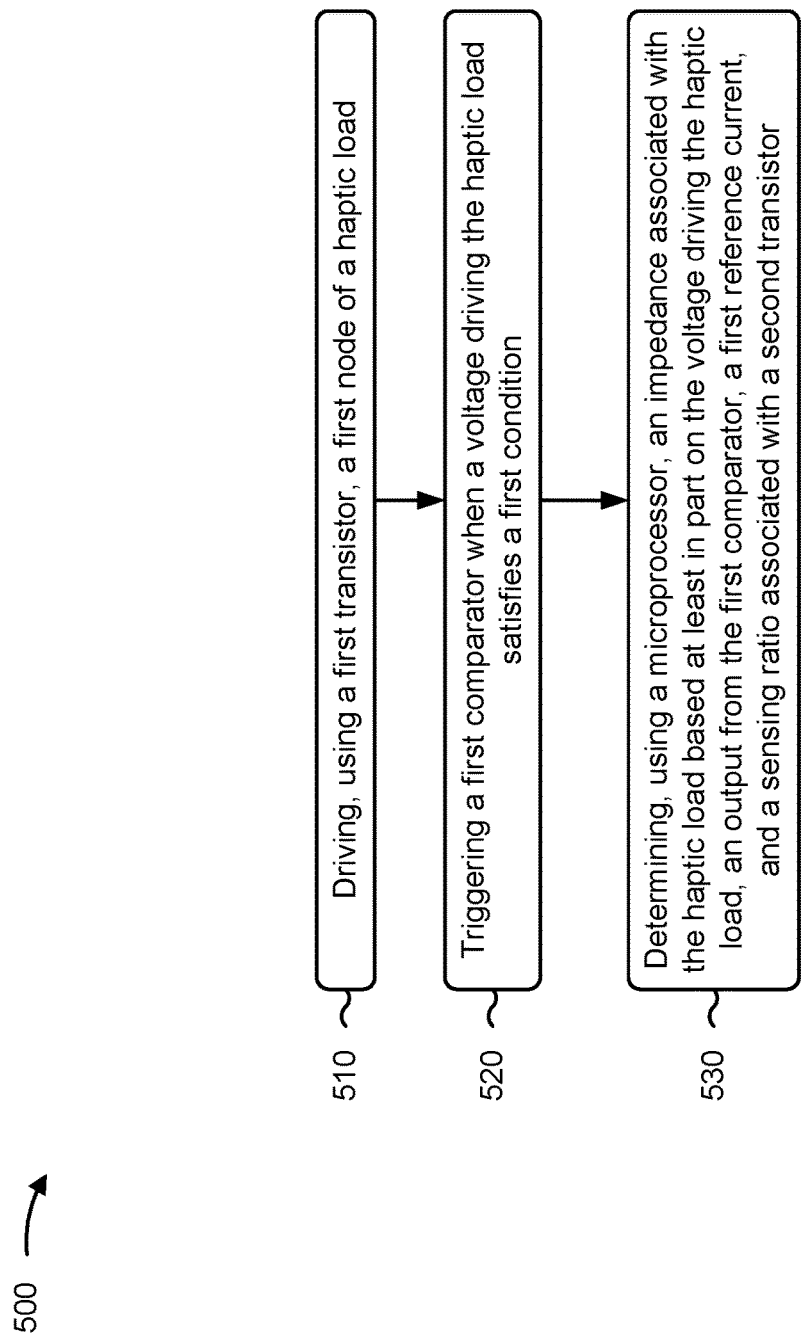
FIGS. 5 and 6 are flowcharts of example processes associated with detecting impedance of a haptic load, in accordance with various aspects of the present disclosure.

FIG. 5 is a flowchart of an example process 500 associated with impedance measurement for a haptic load. In some implementations, one or more process blocks of FIG. 5 may be performed by a measurement circuit (e.g., measurement circuit 300, measurement circuit 300', and/or measurement circuit 300"). In some implementations, one or more process blocks of FIG. 5 may be performed by another device or a group of devices separate from or including the measurement circuit, such as a haptic system (e.g., haptic system 240). Additionally, or alternatively, one or more process blocks of FIG. 5 may be performed by one or more components of device 200, such as processor 210, memory 215, storage component 220, input component 225, output component 230, and/or communication interface 235.

As shown in FIG. 5, process 500 may include driving, using a first transistor, a first node of a haptic load (block 510). For example, the measurement circuit may drive (e.g., using at least one first transistor 302a) the first node of the haptic load, as described above.

As further shown in FIG. 5, process 500 may include triggering a first comparator when a voltage driving the haptic load satisfies a first condition (block 520). For example, the measurement circuit may trigger (e.g., using first comparator 304a) when the voltage driving the haptic load satisfies the first condition, as described above. In some implementations, the first comparator may have a first node connected, in parallel, to a drain of a second transistor (e.g., at least one second transistor 303a) and may have a second node connected to the first node of the haptic load. Additionally, the second transistor may have a gate connected to a gate of the first transistor and may have the drain connected to a first reference current.

As further shown in FIG. 5, process 500 may include determining, using a microprocessor, an impedance associated with the haptic load based at least in part on the voltage driving the haptic load, an output from the first comparator, the first reference current, and a sensing ratio associated with the second transistor (block 530). For example, the measurement circuit may determine (e.g., using the microprocessor) the impedance associated with the haptic load, as described above.

Process 500 may include additional implementations, such as any single implementation or any combination of implementations described below and/or in connection with one or more other processes described elsewhere herein.

In a first implementation, the haptic load comprises an LRA.

In a second implementation, alone or in combination with the first implementation, process 500 further includes driving (e.g., using at least one third transistor 302b), a second node of the haptic load, and triggering (e.g., using second comparator 304b) when the voltage driving the haptic load satisfies a second condition. The second comparator may have a first node connected, in parallel, to a drain of a fourth transistor (e.g., at least one fourth transistor 303b) and may have a second node connected to the second node of the haptic load. Additionally, the fourth transistor may have a gate connected to a gate of the third transistor and may have the drain connected to a second reference current.

In a third implementation, alone or in combination with one or more of the first and second implementations, process 500 further includes combining (e.g., using gate 305) an output from the first comparator with an output from the second comparator. The gate may be connected to the first comparator and the second comparator.

In a fourth implementation, alone or in combination with one or more of the first through third implementations, process 500 further includes comparing (e.g., using the microprocessor) the impedance associated with the haptic load to a threshold, and generating (e.g., using the microprocessor) an error signal when the impedance satisfies the threshold.

In a fifth implementation, alone or in combination with one or more of the first through fourth implementations, process 500 further includes sweeping (e.g., using the microprocessor) a plurality of voltages driving the haptic load, and determining (e.g., using the microprocessor) an impedance associated with the haptic load based at least in part on a binary search using the plurality of voltages.

In a sixth implementation, alone or in combination with one or more of the first fifth sixth implementations, process 500 further includes sweeping (e.g., using the microprocessor) a plurality of reference currents for the second transistor, and determining (e.g., using the microprocessor) an impedance associated with the haptic load based at least in part on a binary search using the plurality of reference currents.

In a seventh implementation, alone or in combination with one or more of the first through sixth implementations, process 500 further includes sweeping (e.g., using the microprocessor) a plurality of sensing ratios associated with the second transistor, and determining (e.g., using the microprocessor) an impedance associated with the haptic load based at least in part on a binary search using the plurality of sensing ratios.

In an eighth implementation, alone or in combination with one or more of the first through seventh implementations, a source of the first transistor and a source of the second transistor are connected to a power source.

In a ninth implementation, alone or in combination with one or more of the first through eighth implementations, a source of the first transistor and a source of the second transistor are connected to ground.

In a tenth implementation, alone or in combination with one or more of the first through ninth implementations, process 500 further includes driving (e.g., using the microprocessor) the haptic load using a voltage waveform, and determining (e.g., using the microprocessor) an impedance associated with the haptic load based at least in part on a trigger point that is associated with the voltage waveform and that is determined based at least in part on an output of the first comparator.

In an eleventh implementation, alone or in combination with one or more of the first through tenth implementations, the voltage waveform comprises a sine wave or a triangular wave.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

Figure 6:
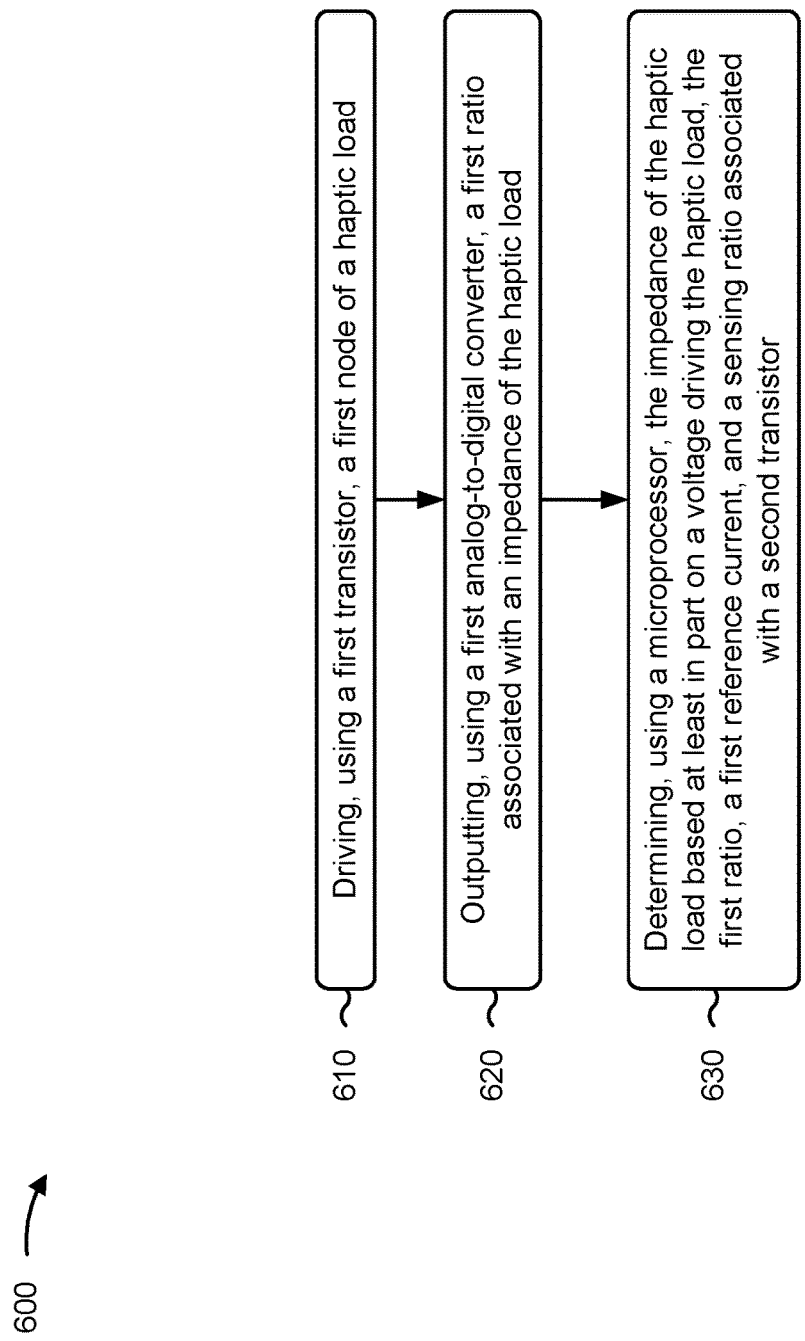

FIG. 6 is a flowchart of an example process 600 associated with impedance measurement for a haptic load. In some implementations, one or more process blocks of FIG. 6 may be performed by a measurement circuit (e.g., measurement circuit 400, measurement circuit 400', and/or measurement circuit 400"). In some implementations, one or more process blocks of FIG. 6 may be performed by another device or a group of devices separate from or including the measurement circuit, such as a haptic system (e.g., haptic system 240). Additionally, or alternatively, one or more process blocks of FIG. 6 may be performed by one or more components of device 200, such as processor 210, memory 215, storage component 220, input component 225, output component 230, and/or communication interface 235.

As shown in FIG. 6, process 600 may include driving, using a first transistor, a first node of a haptic load (block 610). For example, the measurement circuit may drive (e.g., using at least one first transistor 402a) the first node of the haptic load, as described above.

As further shown in FIG. 6, process 600 may include outputting, using a first ADC, a first ratio associated with an impedance of the haptic load (block 620). For example, the measurement circuit may output (e.g., using first ADC 404a) the first ratio associated with the impedance of the haptic load, as described above. In some implementations, the first ADC may have a first node connected, in parallel, to a drain of a second transistor (e.g., at least one second transistor 403a) and may have a second node connected to the first node of the haptic load. Additionally, the second transistor may have a gate connected to a gate of the first transistor and may have the drain connected to a first reference current.

As further shown in FIG. 6, process 600 may include determining, using a microprocessor, the impedance of the haptic load based at least in part on a voltage driving the haptic load, the first ratio, the first reference current, and a sensing ratio associated with the second transistor (block 630). For example, the measurement circuit may determine (e.g., using the microprocessor) the impedance associated with the haptic load, as described above.

Process 600 may include additional implementations, such as any single implementation or any combination of implementations described below and/or in connection with one or more other processes described elsewhere herein.

In a first implementation, the haptic load comprises an LRA.

In a second implementation, alone or in combination with the first implementation, process 600 further includes driving (e.g., using at least one third transistor 403b) a second node of the haptic load, and outputting (e.g., using second ADC 404b) a second ratio associated with an impedance of the haptic load. The second ADC may have a first node connected, in parallel, to a drain of a fourth transistor (e.g., at least one second transistor 404b) and may have a second node connected to the second node of the haptic load. Additionally, the fourth transistor may have a gate connected to a gate of the third transistor and may have the drain connected to a second reference current.

In a third implementation, alone or in combination with one or more of the first and second implementations, process 600 further includes comparing (e.g., using the microprocessor) the impedance of the haptic load to a threshold, and generating (e.g., using the microprocessor) an error signal when the impedance satisfies the threshold.

In a fourth implementation, alone or in combination with one or more of the first through third implementations, a source of the first transistor and a source of the second transistor are connected to a power source.

In a fifth implementation, alone or in combination with one or more of the first through fourth implementations, a source of the first transistor and a source of the second transistor are connected to ground.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

The following provides an overview of some aspects of the present disclosure:

Aspect 1: A method performed by a measurement circuit, comprising: driving, using a first transistor, a first node of a haptic load, and triggering a first comparator when a voltage driving the haptic load satisfies a first condition, wherein the first comparator has a first node connected, in parallel, to a drain of a second transistor and has a second node connected to the first node of the haptic load, and wherein the second transistor has a gate connected to a gate of the first transistor and has the drain connected to a first reference current.

Aspect 2: The method of aspect 1, wherein the haptic load comprises a linear resonant actuator.

Aspect 3: The method of any of aspects 1 through 2, further comprising: driving, using a third transistor, a second node of the haptic load; and triggering a second comparator when the voltage driving the haptic load satisfies a second condition, wherein the second comparator has a first node connected, in parallel, to a drain of a fourth transistor and has a second node connected to the second node of the haptic load, and wherein the fourth transistor has a gate connected to a gate of the third transistor and has the drain connected to a second reference current.

Aspect 4: The method of aspect 3, further comprising: combining an output from the first comparator with an output from the second comparator at a gate, wherein the gate is connected to the first comparator and the second comparator.

Aspect 5: The method of any of aspects 1 through 4, further comprising: determining, using a microprocessor, an impedance associated with the haptic load based at least in part on the voltage driving the haptic load, an output from the first comparator, the first reference current, and a sensing ratio associated with the second transistor.

Aspect 6: The method of aspect 5, further comprising: comparing, using the microprocessor, the impedance associated with the haptic load to a threshold; and generating, using the microprocessor, an error signal when the impedance satisfies the threshold.

Aspect 7: The method of any of aspects 1 through 6, further comprising: sweeping, using a microprocessor, a plurality of voltages driving the haptic load; and determining, using the microprocessor, an impedance associated with the haptic load based at least in part on a binary search using the plurality of voltages.

Aspect 8: The method of any of aspects 1 through 7, further comprising: sweeping, using a microprocessor, a plurality of reference currents for the second transistor; and determining, using the microprocessor, an impedance associated with the haptic load based at least in part on a binary search using the plurality of reference currents.

Aspect 9: The method of any of aspects 1 through 8, further comprising: sweeping, using a microprocessor, a plurality of sensing ratios associated with the second transistor; and determining, using the microprocessor, an impedance associated with the haptic load based at least in part on a binary search using the plurality of sensing ratios.

Aspect 10: The method of any of aspects 1 through 9, wherein a source of the first transistor and a source of the second transistor are connected to a power source.

Aspect 11: The method of any of aspects 1 through 9, wherein a source of the first transistor and a source of the second transistor are connected to ground.

Aspect 12: The method of any of aspects 1 through 11, further comprising: driving, with a microprocessor, the haptic load using a voltage waveform; and determining, using the microprocessor, an impedance associated with the haptic load based at least in part on a trigger point that is associated with the voltage waveform and that is determined based at least in part on an output of the first comparator.

Aspect 13: The method of aspect 12, wherein the voltage waveform comprises a sine wave or a triangular wave.

Aspect 14: A method performed by a measurement circuit, comprising: driving, using a first transistor, a first node of a haptic load; and outputting, using a first analog-to-digital converter, a first ratio associated with an impedance of the haptic load, wherein the first analog-to-digital converter has a first node connected, in parallel, to a drain of a second transistor and has a second node connected to the first node of the haptic load, and wherein the second transistor has a gate connected to a gate of the first transistor and has the drain connected to a first reference current.

Aspect 15: The method of aspect 14, wherein the haptic load comprises a linear resonant actuator.

Aspect 16: The method of any of aspects 14 through 15, further comprising: driving, using a third transistor, a second node of the haptic load; and outputting, using a second analog-to-digital converter, a second ratio associated with an impedance of the haptic load, wherein the second analog-to-digital converter has a first node connected, in parallel, to a drain of a fourth transistor and has a second node connected to the second node of the haptic load, and wherein the fourth transistor has a gate connected to a gate of the third transistor and has the drain connected to a second reference current.

Aspect 17: The method of any of aspects 14 through 16, further comprising: determining, using a microprocessor, the impedance of the haptic load based at least in part on a voltage driving the haptic load, the first ratio, the first reference current, and a sensing ratio associated with the second transistor.

Aspect 18: The method of aspect 17, further comprising: comparing, using the microprocessor, the impedance of the haptic load to a threshold; and generating, using the microprocessor, an error signal when the impedance satisfies the threshold.

Aspect 19: The method of any of aspects 14 through 18, wherein a source of the first transistor and a source of the second transistor are connected to a power source.

Aspect 20: The method of any of aspects 14 through 18, wherein a source of the first transistor and a source of the second transistor are connected to ground.

Aspect 21: A measurement circuit to perform the method of one or more aspects of aspects 1-13.

Aspect 22: A device, comprising a memory and one or more processors coupled to the memory, the memory and the one or more processors configured to perform the method of one or more aspects of aspects 1-13.

Aspect 23: An apparatus, comprising at least one means for performing the method of one or more aspects of aspects 1-13.

Aspect 24: A non-transitory computer-readable medium storing code, the code comprising instructions executable by one or more microprocessors to perform the method of one or more aspects of aspects 1-13.

Aspect 25: A non-transitory computer-readable medium storing a set of instructions, the set of instructions comprising one or more instructions that, when executed by one or more microprocessors, cause the one or more microprocessors to perform the method of one or more aspects of aspects 1-13.

Aspect 26: A measurement circuit to perform the method of one or more aspects of aspects 14-20.

Aspect 27: A device, comprising a memory and one or more processors coupled to the memory, the memory and the one or more processors configured to perform the method of one or more aspects of aspects 14-20.

Aspect 28: An apparatus, comprising at least one means for performing the method of one or more aspects of aspects 14-20.

Aspect 29: A non-transitory computer-readable medium storing code, the code comprising instructions executable by one or more microprocessors to perform the method of one or more aspects of aspects 14-20.

Aspect 30: A non-transitory computer-readable medium storing a set of instructions, the set of instructions comprising one or more instructions that, when executed by one or more microprocessors, cause the one or more microprocessors to perform the method of one or more aspects of aspects 14-20.

The foregoing disclosure provides illustration and description, but is not intended to be exhaustive or to limit the aspects to the precise forms disclosed. Modifications and variations may be made in light of the above disclosure or may be acquired from practice of the aspects.

As used herein, the term "component" is intended to be broadly construed as hardware, firmware, and/or a combination of hardware and software. As used herein, a processor is implemented in hardware, firmware, and/or a combination of hardware and software. It will be apparent that systems and/or methods described herein may be implemented in different forms of hardware, firmware, and/or a combination of hardware and software. The actual specialized control hardware or software code used to implement these systems and/or methods is not limiting of the aspects. Thus, the operation and behavior of the systems and/or methods were described herein without reference to specific software code—it being understood that software and hardware can be designed to implement the systems and/or methods based, at least in part, on the description herein.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various aspects. In fact, many of these features may be combined in ways not specifically recited in the claims and/or disclosed in the specification. Although each dependent claim listed below may directly depend on only one claim, the disclosure of various aspects includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Furthermore, as used herein, the terms "set" and "group" are intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:
1. A measurement circuit, comprising:
a first transistor configured to drive a first node of a haptic load;
a second transistor having a gate connected to a gate of the first transistor and a drain connected to a first reference current;

a first comparator having a first node connected, in parallel, to the drain of the second transistor, and having a second node connected to the first node of the haptic load, wherein the first comparator triggers when a voltage driving the haptic load satisfies a first condition;

a third transistor configured to drive a second node of the haptic load;

a fourth transistor having a gate connected to a gate of the third transistor and a drain connected to a second reference current; and a second comparator having a first node connected, in parallel, to the drain of the fourth transistor, and having a second node connected to the second node of the haptic load, wherein the second comparator triggers when the voltage driving the haptic load satisfies a second condition.

2. The measurement circuit of claim 1, wherein the haptic load comprises a linear resonant actuator.

3. The measurement circuit of claim 1, further comprising: a gate connected to the first comparator and the second comparator and configured to combine an output from the first comparator with an output from the second comparator.

4. The measurement circuit of claim 1, further comprising:
a microprocessor configured to determine an impedance associated with the haptic load based at least in part on the voltage driving the haptic load, an output from the first comparator, the first reference current, and a sensing ratio associated with the second transistor.

5. The measurement circuit of claim 4, wherein the microprocessor is further configured to compare the impedance, associated with the haptic load, to a threshold, and to generate an error signal when the impedance satisfies the threshold.

6. The measurement circuit of claim 1, further comprising:
a microprocessor configured to sweep a plurality of voltages driving the haptic load and determine an impedance, associated with the haptic load, based at least in part on a binary search using the plurality of voltages.

7. The measurement circuit of claim 1, further comprising:
a microprocessor configured to sweep a plurality of reference currents for the second transistor and determine an impedance, associated with the haptic load, based at least in part on a binary search using the plurality of reference currents.

8. The measurement circuit of claim 1, further comprising:
a microprocessor configured to sweep a plurality of sensing ratios associated with the second transistor and determine an impedance, associated with the haptic load, based at least in part on a binary search using the plurality of sensing ratios.

9. The measurement circuit of claim 1, wherein a source of the first transistor and a source of the second transistor are connected to a power source.

10. The measurement circuit of claim 1, wherein a source of the first transistor and a source of the second transistor are connected to ground.

11. The measurement circuit of claim 1, further comprising:
a microprocessor configured to use a voltage waveform to drive the haptic load and determine an impedance, associated with the haptic load, based at least in part on a trigger point that is associated with the voltage waveform and that is determined based at least in part on an output of the first comparator.

12. The measurement circuit of claim 11, wherein the voltage waveform comprises a sine wave or a triangular wave.

13. A method performed by a measurement circuit, comprising:
driving, using a first transistor, a first node of a haptic load;
triggering a first comparator when a voltage driving the haptic load satisfies a first condition, wherein the first comparator has a first node connected, in parallel, to a drain of a second transistor and has a second node connected to the first node of the haptic load, and wherein the second transistor has a gate connected to a gate of the first transistor and has the drain connected to a first reference current;
driving, using a third transistor, a second node of the haptic load; and
triggering a second comparator when the voltage driving the haptic load satisfies a second condition, wherein the second comparator has a first node connected, in parallel, to a drain of a fourth transistor and has a second node connected to the second node of the haptic load, and wherein the fourth transistor has a gate connected to a gate of the third transistor and has the drain connected to a second reference current.

14. The method of claim 13, wherein the haptic load comprises a linear resonant actuator.

15. The method of claim 13, further comprising: combining an output from the first comparator with an output from the second comparator at a gate, wherein the gate is connected to the first comparator and the second comparator.

16. The method of claim 13, further comprising:
determining, using a microprocessor, an impedance associated with the haptic load based at least in part on the voltage driving the haptic load, an output from the first comparator, the first reference current, and a sensing ratio associated with the second transistor.

17. The method of claim 16, further comprising:
comparing, using the microprocessor, the impedance associated with the haptic load to a threshold; and
generating, using the microprocessor, an error signal when the impedance satisfies the threshold.

18. The method of claim 13, further comprising:
sweeping, using a microprocessor, a plurality of voltages driving the haptic load; and
determining, using the microprocessor, an impedance associated with the haptic load based at least in part on a binary search using the plurality of voltages.

19. The method of claim 13, further comprising:
sweeping, using a microprocessor, a plurality of reference currents for the second transistor; and
determining, using the microprocessor, an impedance associated with the haptic load based at least in part on a binary search using the plurality of reference currents.

20. The method of claim 13, further comprising:
sweeping, using a microprocessor, a plurality of sensing ratios associated with the second transistor; and
determining, using the microprocessor, an impedance associated with the haptic load based at least in part on a binary search using the plurality of sensing ratios.

21. The method of claim 13, wherein a source of the first transistor and a source of the second transistor are connected to a power source.

22. The method of claim 13, wherein a source of the first transistor and a source of the second transistor are connected to ground.

23. The method of claim 13, further comprising:
driving, with a microprocessor, the haptic load using a voltage waveform; and
determining, using the microprocessor, an impedance associated with the haptic load based at least in part on a trigger point that is associated with the voltage waveform and that is determined based at least in part on an output of the first comparator.

24. The method of claim 23, wherein the voltage waveform comprises a sine wave or a triangular wave.

25. A non-transitory computer-readable medium storing a set of instructions, the set of instructions comprising:
one or more instructions that, when executed by one or more microprocessors, cause the one or more microprocessors to:
transmit an instruction to drive, using a first transistor, a first node of a haptic load;
receive output from a first comparator when a voltage driving the haptic load satisfies a first condition, wherein the first comparator has a first node connected, in parallel, to a drain of a second transistor and has a second node connected to the first node of the haptic load, and wherein the second transistor has a gate connected to a gate of the first transistor and has the drain connected to a first reference current;
transmit an instruction to drive, using a third transistor, a second node of the haptic load; and
receive output from a second comparator when the voltage driving the haptic load satisfies a second condition, wherein the second comparator has a first node connected, in parallel, to a drain of a fourth transistor and has a second node connected to the second node of the haptic load, and wherein the fourth transistor has a gate connected to a gate of the third transistor and has the drain connected to a second reference current.

26. An apparatus, comprising:
means for driving, using a first transistor, a first node of a haptic load;
means for triggering a first comparator when a voltage driving the haptic load satisfies a first condition, wherein the first comparator has a first node connected, in parallel, to a drain of a second transistor and has a second node connected to the first node of the haptic load, and wherein the second transistor has a gate connected to a gate of the first transistor and has the drain connected to a first reference current;
means for driving, using a third transistor, a second node of the haptic load; and
means for triggering a second comparator when the voltage driving the haptic load satisfies a second condition, wherein the second comparator has a first node connected, in parallel, to a drain of a fourth transistor and has a second node connected to the second node of the haptic load, and wherein the fourth transistor has a gate connected to a gate of the third transistor and has the drain connected to a second reference current.

* * * * *